United States Patent [19]

Randall

[11] Patent Number: 5,096,846

[45] Date of Patent: Mar. 17, 1992

[54] METHOD OF FORMING A QUANTUM EFFECT SWITCHING DEVICE

[75] Inventor: John N. Randall, Richardson, Tex.

[73] Assignee: Texas Instruments Incorporated, Dallas, Tex.

[21] Appl. No.: 608,406

[22] Filed: Nov. 2, 1990

[51] Int. Cl.⁵ .................................. H01L 21/265
[52] U.S. Cl. .................................. 437/40; 437/41; 437/44; 437/45; 437/189; 148/DIG. 100; 357/4; 357/56
[58] Field of Search ............. 437/40, 41, 189, 44, 437/45; 148/DIG. 100

[56] References Cited

U.S. PATENT DOCUMENTS

| | | | |
|---|---|---|---|
| 4,472,237 | 9/1984 | Deslauriers et al. | 148/DIG. 100 |
| 4,503,447 | 3/1985 | Iafrate et al. | 437/107 |
| 4,783,427 | 11/1988 | Reed et al. | 437/90 |
| 4,912,531 | 3/1990 | Reed et al. | 357/4 |
| 4,980,312 | 12/1990 | Harris et al. | 148/DIG. 100 |
| 5,006,488 | 4/1991 | Previti-Kelly | 148/DIG. 100 |
| 5,023,671 | 6/1991 | DiVincento et al. | 357/55 |

FOREIGN PATENT DOCUMENTS

| | | | |
|---|---|---|---|
| 59-232423 | 12/1984 | Japan | 148/DIG. 100 |
| 60-231331 | 11/1985 | Japan | 148/DIG. 100 |

*Primary Examiner*—Brian E. Hearn
*Assistant Examiner*—Kevin M. Picardat
*Attorney, Agent, or Firm*—Douglas A. Sorensen; Richard L. Donaldson; Stanton C. Braden

[57] ABSTRACT

A method for forming a quantum effect switching device is disclosed which comprises the step of forming a heterostructure substrate 10. A silicon nitride layer 22 is formed on an outer surface of the substrate 10. An aluminum mask body 30 is formed using a lift-off procedure. Aluminum mask body 30 is then used to form a silicon nitride mask body 32 from the silicon nitride layer 22 using a $CF_4/O_2$ reactive ion etch process. A boron trichloride etch process is then used to form a dual column structure 34 while removing the aluminum mask body 30. A buffered HF wet etch process removes the silicon nitride mask body 32. Separate metal contacts can then be made to electrically separate points on the outer surface of the dual column structure 34.

18 Claims, 2 Drawing Sheets

METHOD OF FORMING A QUANTUM EFFECT SWITCHING DEVICE

TECHNICAL FIELD OF THE INVENTION

This invention relates in general to the field of integrated electronic devices and more particularly to an improved method of forming a quantum effect switching device.

BACKGROUND OF THE INVENTION

Gary Frazier and James Luscombe of Texas Instruments have developed one embodiment of a quantum effect switching device which utilizes a dumbbell-shaped column structure to create a three terminal switching device which uses quantum effects. This embodiment is described in Frazier and Luscombe's copending application, Serial No. 07/608,509, entitled "Quantum Effect Switching Device", filed concurrently herewith and assigned to the Assignee of the present application, the disclosure of which is hereby incorporated by reference into the present application.

The creation of column structures such as those described herein requires an etchant process which exhibits an extremely high level of anisotropy. There is a certain degree of tradeoff between selectivity and anisotropy in the selection of an etchant process to form these column structures. As such, an etchant process such as a boron trichloride reactive ion etch which exhibits an extremely high level of anisotropy exhibits a large component of ion impact etching during the etch operation. Because of this high component of ion impact etching, extremely robust mask materials such as metal have been used to create these column structures. The use of metal as an etch mask has been very successful in the creation of single column structures and has the added benefit of creating a contact point on the top of the column structure. However, when a dumbbell-shaped column structure is desired, the use of a metal mask creates a short across the two columns preventing separate electrical contact at each of the columns.

Accordingly, a need has arisen for a process which allows for the highly anisotropic formation of double column structures but which does not use mask materials which electrically short the entire outer surface of the column structure.

SUMMARY OF THE INVENTION

In accordance with the present invention, a method for forming a quantum effect switching device is provided which substantially eliminates or reduces disadvantages or problems associated with prior art methods. The method of the present invention is accomplished by forming a first mask layer on an outer surface of a substrate. A second mask body is formed on an outer surface of the first mask layer. A first mask body is formed from the first mask layer using an etchant which is selective to the material comprising the second mask body. A column structure is then formed in the substrate using the first mask body and an etchant which is selective to the material comprising the first mask body. The first mask body is then removed.

According to one specific embodiment of the present invention, the method begins with the formation of a quantum effect heterostructure substrate which incorporates a quantum well layer and quantum well barrier layers on either side. A layer of silicon nitride is plasma deposited on an outer surface of the underlying heterostructure substrate. An aluminum mask structure incorporating the dumbbell shape of the column to be formed is formed on an outer surface of the silicon nitride layer. A $CF_4$ reactive ion etch process is then used to etch the silicon nitride layer using the aluminum mask to transfer the dumbbell pattern into the silicon nitride. A second reactive ion etch process using boron trichloride is then used to anisotropically etch the heterostructure substrate into the dumbbell shaped column. The boron trichloride etch process removes the aluminum but does not remove the silicon nitride. A buffered HF wet etch process is then used to remove the silicon nitride. Polyimide isolation material can then be deposited surrounding the column structure and planerized back to expose the outer portion of the column structure. Contacts can then be individually made to separate points on the outer surface of the dumbbell structure outwardly from the polyimide isolation material.

An important technical advantage of the method of the present invention inheres in the fact that it uses a dual mask structure to allow for a high degree of anisotropy without using a mask which would short out the outer surface of the column structure formed.

BRIEF DESCRIPTION OF THE DRAWINGS

A more complete understanding of the present invention may be acquired by referring to the detailed description and claims when considered in connection with the accompanying drawings in which like reference numbers indicate like features and wherein:

DETAILED DESCRIPTION OF THE INVENTION

Figure 1A:
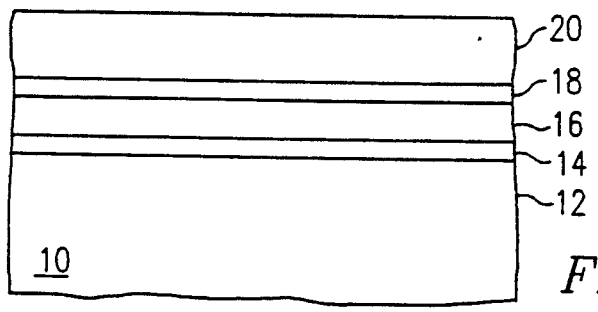
FIG. 1a through 1g are sequential, cross-sectional, elevational diagrams which illustrate the process steps used in accordance with the teachings of the present invention.

FIGS. 1a through 1g illustrate a series of process steps which may be used to practice the teachings of the present invention to construct a quantum effect switching device having a dumbbell-shaped column structure or which may be used to construct other similar structures which require etch processes having a high level of anisotropy but which also require the ability to separately contact various points on the outer surface of the final structure. Referring to FIG. 1a, the process of the present invention begins with the forming a heterostructure substrate through the use of molecular beam epitaxy. A heterostructure substrate 10 is illustrated which comprises a source layer 12 which may comprise heavily doped N+gallium arsenide grown through molecular beam epitaxy or other suitable processes. As described in the "Quantum Effect Switching Device" application cited previously, the concentration of the dopants in the heterostructure substrate 10 is adjusted to provide for the correct amount of surface depletion effects to allow for the formation of a quantum dot structure at the center of the column to be formed by the processes of the present invention.

A first tunnel barrier layer 14 comprising aluminum gallium arsenide is grown using molecular beam epitaxy or other suitable processes to a thickness on the order of 50 Angstroms on an outer surface of source layer 12. A quantum well layer 16 which may comprise, for example, intrinsic gallium arsenide is then grown on an outer surface of first tunnel barrier layer 14 using molecular beam epitaxy or other suitable processes to a thickness on the order of 100 Angstroms. A second tunnel barrier layer 18 which may comprise a layer of aluminum gallium arsenide grown to a thickness on the order of 50 Angstroms is then formed using molecular beam epitaxy or other suitable processes on an outer surface of quantum layer 16. A drain layer 20 which may comprise, for example, heavily doped N+ gallium arsenide is then formed on an outer surface of second tunnel barrier layer 18 using molecular beam epitaxy or other suitable processes. Drain layer 20 has a dopant concentration similar to source layer 12 for the reasons discussed previously.

Figure 1B:
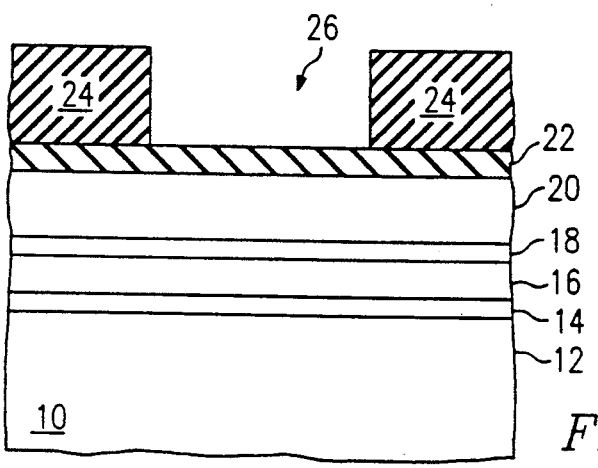

Referring to FIG. 1b, a layer of silicon nitride 22 is deposited on an outer surface of drain layer 20 to a thickness on the order of 500 to 1000 Angstroms. A layer of photoresist 24 is then deposited and patterned and exposed to provide an opening indicated generally at 26 in the shape of the dumbbell structure to be formed. Due to the sizes of the features incorporated into the quantum effect switching device formed according to the teachings of the present invention, the processes used to pattern photo resist layer 24 and form opening 26 must be capable of forming features dimensioned on the order of a tenth of a micron. For example, opening 26 is on the order of two tenths of a micron in width as each of the individual columns are on the order of one tenth of a micron in diameter. Accordingly, processes such as electron beam lithography, ion beam lithography or x-ray lithography are best suited to form structures having these extremely small dimensions.

Figure 1C:
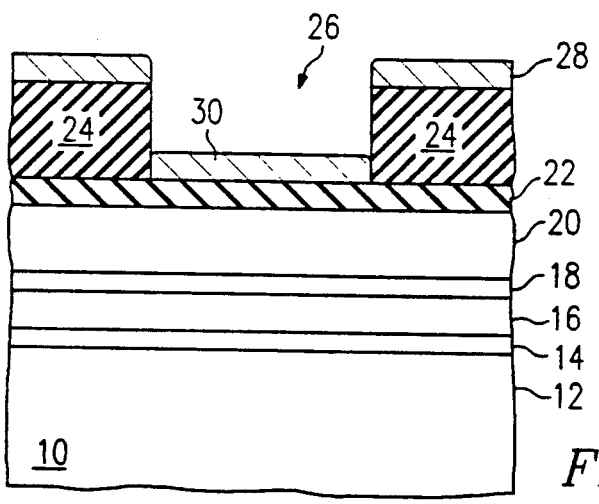

Referring to FIG. 1c, a layer of aluminum 28 is deposited to a thickness on the order of 1000 Angstroms. During the deposition of layer 28, an aluminum mask body 30 is formed covering the outer surface of silicon nitride layer 22 within opening 26.

Figure 1D:
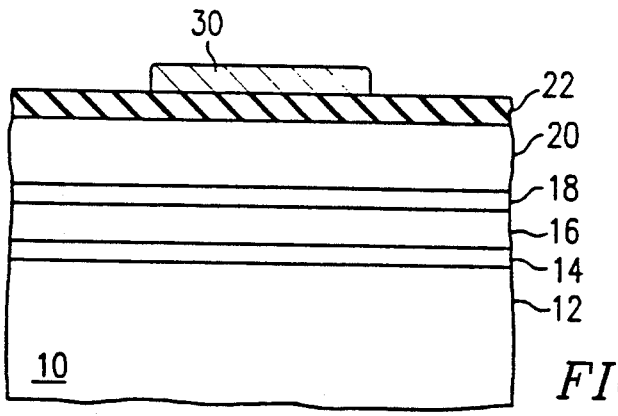

Referring to FIG. 1d, a conventional lift-off procedure is used to dissolve the photoresist layer 24 and lift-off the portions of aluminum layer 28 leaving aluminum mask body 30 covering a selected outer portion of silicon nitride layer 22.

Figure 1E:
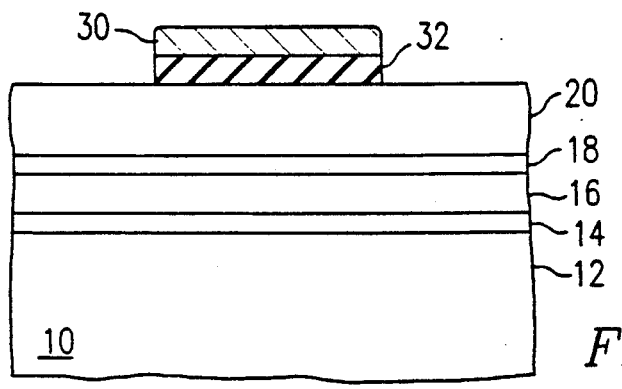

Referring to FIG. 1e, a $CF_4/O_2$ reactive ion etch process is used to pattern silicon nitride layer 22 leaving a silicon nitride mask body 32 disposed inwardly from aluminum mask body 30. The $CF_4/O_2$ reactive ion etch process is a highly selective process which etches only the silicon nitride and leaves aluminum mask body 30 and the gallium arsenide within drain layer 20 relatively unaffected. This selectivity combined with the anisotropy of the etch assures an accurate transfer of the pattern in the aluminum mask body 30 to prevent the silicon nitride mask body 32. As used herein, when an etch process is said to be "selective" to a first material relative to a second material, the etch process will etch the second material to a greater degree than the first material.

Figure 1F:
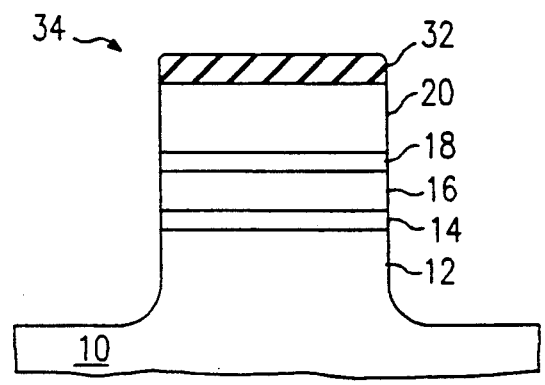

Referring to FIG. 1f, a boron trichloride etch process or other suitable etch process is used to anisotropically etch the heterostructure substrate 10 to form the double column structure indicated generally at 34. As can be seen in FIG. 1f, the boron trichloride etch process removes aluminum mask body 30 but does not etch silicon nitride mask body 32. Silicon nitride mask body 32 provides an excellent mask for the boron trichloride etch process and provides for an excellent level of anisotropy during this process. Anisotropic ratios of greater than 30:1 can be achieved using a boron trichloride etch and a silicon nitride mask to create the dumbbell shaped column structures required for the quantum effect switching device as well as other structures requiring similar feature dimensions.

Figure 1G:
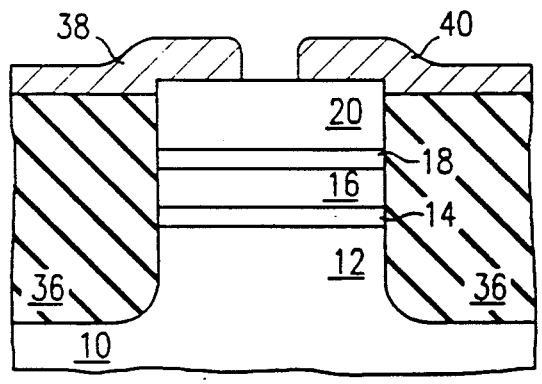

Referring to FIG. 1g, a buffered HF wet chemical etch process or other suitable process is used to remove the silicon nitride mask body 32. A layer of polyimide isolation material 36 is then deposited covering the column structure 34. Polyimide layer 36 is then planerized using a suitable oxygen based etchant process to expose the outer portions of column structure 34. A drain contact 38 and a gate contact 40 can then be formed using electron beam lithography or other suitable methods from suitable conductors such as gold. Depending upon the desired device characteristics, drain contact 38 and gate contact 40 may be formed such that they both make ohmic contact with layer 20. In this case, contacts 38 and 40 may be formed simultaneously. Alternatively, either contact 38 or 40 may be formed to be a higher impedance contact by causing either contact 38 or 40 to be in Shottky contact with layer 20. Either ohmic or Schottky contacts can be formed using known methods and alloys to selectively form drain contact 38 and gate contact 40.

Accordingly, the use of the two mask bodies such as aluminum mask body 30 and silicon nitride mask body 32 allows for the formation of a column structure 34 which requires an extremely high level of anisotropy in its formation without the use of a gold mask body which would prevent individual contacts to be made to separate points on the outer surface of the final structure.

Figure 2:
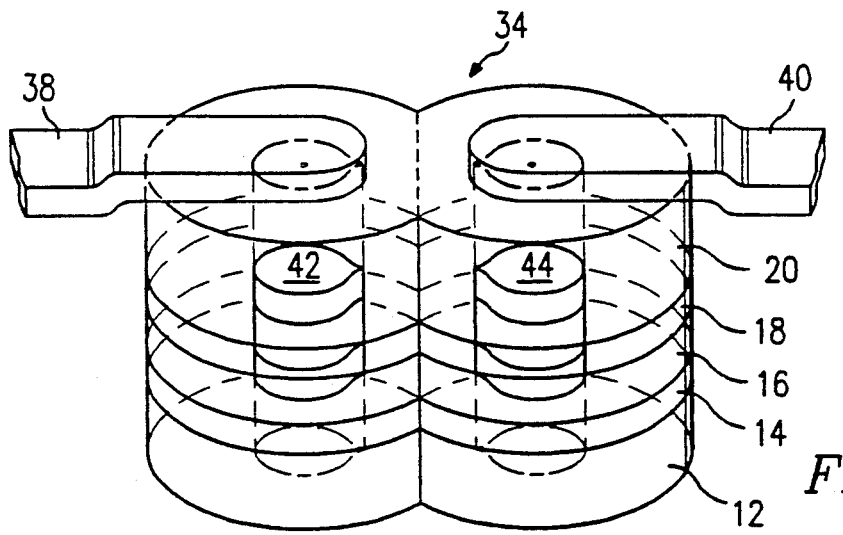
FIG. 2 is an elevational schematic illustration of a quantum effect switching device constructed using the teachings of the present invention.

FIG. 2 is an elevational schematic diagram which illustrates the completed structure of the quantum effect switching device constructed using the method of the present invention. Referring to FIG. 2, drain contact 38 and gate contact 40 can be seen contacting the two separate points on the outer portion of the double column structure 34. For purposes of clarity, polyimide layer 36 has been omitted. Through the operation of surface depletion effects which are fully described in the "Quantum Effect Switching Device" application cited previously, a pair of quantum dot structures 42 and 44 are formed at the center of the dual column structure 34. In operation, the placement of a potential on gate contact 40 dimensionally modulates the electrical characteristics of the current path between drain contact 38 and source layer 12. This is accomplished by selectively electrically coupling the quantum dot bodies 42 and 44. It is readily apparent that the drain contact 38 and the gate contact 40 must be electrically isolated in order for the proper operation of the device. The method of the present invention allows for the formation of the dual column structure 34 as well as the electrically separate contacting of two points on the outer surface of the column structure 34.

Although the present invention has been described in detail, it should be understood that various changes, substitutions and alterations can be made hereto without departing from the spirit and scope of the invention as defined by the appended claims.

What is claimed is:

1. A method for forming an electronic device, comprising the steps of:

forming a substrate comprising a semiconductor material and having an outer surface;

forming a first mask layer comprising a first mask material and having an outer surface on the outer surface of the substrate;

forming a second mask body comprising a second mask material on the outer surface of the first mask layer;

forming a first mask body disposed between the second mask body and the outer surface of the substrate using a first etchant selective to the second mask and the semiconductor material relative to the first mask material;

forming a column structure from the substrate inwardly form the first mask body using a second etchant selective the first mask material relative to the semiconductor material;

removing the first mask body;

forming a first conductive contact electrically coupled to a first portion of the outer surface of the column structure; and forming a second conductive contact electrically coupled to a second portion of the outer surface of the column structure and not contacting the first conductive contact.

2. The method of claim 1 wherein said step of forming a substrate comprises the steps of:

forming a source layer having an outer surface;

forming, on the outer surface of the source layer, a first tunnel barrier layer having an outer surface;

forming, on the outer surface of the first tunnel barrier layer, a quantum well layer having an outer surface;

forming, on the outer surface of the quantum well layer, a second tunnel barrier layer having an outer surface; and forming, on the outer surface of the second tunnel barrier layer, a drain layer having an outer surface comprising the outer surface of the substrate.

3. The method of claim 2 wherein said steps of forming source, quantum well and drain layers each comprise the step of forming a layer comprising gallium arsenide.

4. The method of claim 2 wherein said steps of forming first and second tunnel barrier layers each comprise the step of forming a layer comprising aluminum gallium arsenide.

5. The method of claim 1 wherein said step of forming a second mask body comprises the steps of:

forming a resist layer disposed on said outer surface of said first mask layer;

removing a selected portion of said resist layer to expose a selected portion of said first mask layer;

depositing said second mask material covering said resist layer and said exposed portion of said first mask layer; and removing the remainder of said resist layer and portions of said second mask material not covering said exposed portion of said first mask layer, said second mask body comprising the portion of said second mask material covering said exposed portion of said first mask layer.

6. The method of claim 1 wherein said step of forming a first mask layer comprises the step of forming a layer comprising silicon nitride.

7. The method of claim 1 wherein said step of forming a second mask body comprises the step of forming a body comprising aluminum.

8. The method of claim 1 wherein said first etchant comprises carbon tetrafluoride.

9. The method of claim 1 wherein said first etchant comprises carbon tetrafluoride and oxygen.

10. The method of claim 1 wherein said second etchant comprises boron trichloride.

11. A method form forming an electronic device, comprising the steps of:

forming a substrate comprising a semiconductor material and having an outer surface;

forming a silicon nitride layer having an outer surface on the surface of the substrate;

forming an aluminum mask body on the outer surface of the silicon nitride layer;

forming a silicon nitride mask body disposed between the aluminum mask body and the outer surface of the substrate using a first etchant selective to aluminum and the semiconductor material relative to silicon nitride;

forming a column structure from the substrate inwardly from the silicon nitride body using a second etchant selective to silicon nitride relative to the semiconductor material;

removing the silicon nitride mask body;

forming a first conductive contact electrically coupled to a first portion of the outer surface of the column structure; and forming a second conductive contact electrically coupled to a second portion of the outer surface of the column structure and not contacting the first conductive contact.

12. The method of claim 11 wherein said step of forming a substrate comprises the steps of:

forming a source layer having an outer surface;

forming, on the outer surface of the source layer, a first tunnel barrier layer having an outer surface;

forming, on the outer surface of the first tunnel barrier layer, a quantum well layer having an outer surface;

forming, on the outer surface of the quantum well layer, a second tunnel barrier layer having an outer surface; and forming, on the outer surface of the second tunnel barrier layer, a drain layer having an outer surface comprising the outer surface of the substrate.

13. The method of claim 12 wherein said steps of forming source, quantum well and drain layers each comprise the step of forming a layer comprising gallium arsenide.

14. The method of claim 12 wherein said steps of forming first and second tunnel barrier layers each comprise the step of forming a layer comprising aluminum gallium arsenide.

15. The method of claim 11 wherein said step of forming an aluminum mask body comprises the steps of:

forming a resist layer disposed on said outer surface of said silicon nitride layer;

removing a selected portion of said resist layer to expose a selected portion of said silicon nitride layer;

depositing aluminum covering said resist layer and said exposed portion of said silicon nitride layer; and removing the remainder of said resist layer and portions of said aluminum not covering said exposed portion of said silicon nitride layer, said aluminum mask body comprising the portion of said aluminum covering said exposed portion of said silicon nitride layer.

16. The method of claim 11 wherein said first etchant comprises carbon tetrafluoride.

17. The method of claim 11 wherein said first etchant comprises carbon tetrafluoride and oxygen.

18. The method of claim 11 wherein said second etchant comprises boron trichloride.

* * * * *